(12) United States Patent
Kim et al.

(10) Patent No.: US 8,293,618 B2
(45) Date of Patent: Oct. 23, 2012

(54) SEMICONDUCTOR DEVICE AND METHOD OF FORMING THE SAME

(75) Inventors: Dongchan Kim, Anyang-si (KR); Sungkweon Baek, Suwon-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 12/551,311

(22) Filed: Aug. 31, 2009

(65) Prior Publication Data
US 2010/0075479 A1    Mar. 25, 2010

(30) Foreign Application Priority Data
Sep. 19, 2008    (KR) .................. 10-2008-0092232

(51) Int. Cl.
*H01L 21/762* (2006.01)
*H01L 21/20* (2006.01)

(52) U.S. Cl. . 438/424; 438/264; 438/431; 257/E21.546; 257/E21.09

(58) Field of Classification Search .................. 438/264, 438/424, 431
See application file for complete search history.

(56) References Cited

U.S. PATENT DOCUMENTS
2009/0004818 A1* 1/2009 Shin et al. ............ 438/435
2009/0047770 A1* 2/2009 Wang et al. ........... 438/431

FOREIGN PATENT DOCUMENTS
| KR | 10-0545700 | 1/2006 |
| KR | 1020070002304 | 1/2007 |
| KR | 1020070050511 | 5/2007 |

OTHER PUBLICATIONS
English Abstract for Publication No. 1020050049840 (for 10-0545700).
English Abstract for Publication No. 1020070050511.
English Abstract for Publication No. 1020070002304.
Jae-kyu Lee, et al., "Investigation of pMOSFET Hot Electron Induced Punch Through (HEIP) in Shallow Trench Isolation," ESSDERC, 2001.

* cited by examiner

Primary Examiner — Alexander Ghyka
(74) Attorney, Agent, or Firm — F. Chau & Associates, LLC

(57) ABSTRACT

A method of forming a semiconductor device includes forming a trench on a semiconductor substrate to define an active region, forming a radical oxide layer on a sidewall and a bottom surface of the trench, and forming a nitride layer on the radical oxide layer. The conduction band offset of the radical oxide layer is greater than the conduction band offset of a thermal oxide layer having the same thickness as the radical oxide layer.

15 Claims, 12 Drawing Sheets

SEMICONDUCTOR DEVICE AND METHOD OF FORMING THE SAME

CROSS-REFERENCE TO RELATED APPLICATION

The present application claims under 35 U.S.C. §119 priority to and the benefit of Korean Patent Application No. 10-2008-0092232, filed on Sep. 19, 2008, in the Korean Intellectual Property Office, the entire content of which is incorporated by reference herein.

BACKGROUND

1. Technical Field

The present disclosure relates to semiconductor devices and, more particularly, to the formation of a device isolation layer of a semiconductor device.

2. Discussion of Related Art

An increase in leakage current in semiconductor devices can lead to an increase in power consumption and heat generation. Thus, performance and reliability of the semiconductor device may deteriorate. For example, if the semiconductor device is installed in a mobile apparatus, the leakage current of the semiconductor device can cause the run time of a portable battery to be reduced. Further, as the integration density of semiconductor devices increases, leakage current may result from off-state leakage current of a transistor, leakage current caused by drain-induced barrier lowering (DIBL), and leakage current caused by hot carriers. As operational voltages of an NMOSFET and a PMOSFET decrease and the channel length of a gate decreases, the leakage current caused by hot carriers can have a strong effect on the reliability and the leakage current of the semiconductor device.

SUMMARY

In accordance with an exemplary embodiment of the present invention a method of forming a semiconductor device is provided. A trench is formed on a semiconductor substrate to define an active region. A radical oxide layer is formed on a sidewall and a bottom surface of the trench. A nitride layer is formed on the radical oxide layer, such that the conduction band offset of the radical oxide layer is greater than that of a thermal oxide layer having the same thickness as the radical oxide layer.

Forming a radical oxide layer may include conformally depositing a semiconductor layer on an entire surface of the semiconductor substrate where the trench is formed and oxidizing the semiconductor layer.

The semiconductor layer may be formed of polysilicon or amorphous silicon.

Conformally depositing a semiconductor layer may include performing an atomic layer deposition process or a chemical vapor deposition process.

Oxidizing the semiconductor layer may include generating free radical atoms from the decomposition of process gas and oxidizing the semiconductor layer using the free radical atoms.

The process gas may contain at least one gas selected from the group consisting of $O_2$, $O_2+H_2$, $N_2O$, or $N_2O+H_2$.

The process gas may further include inert gas.

The radical oxide layer may be formed by free radical atoms generated using at least one process selected from the group consisting of decomposition of process gas using plasma generation, decomposition of process gas using ultraviolet light, or decomposition of process gas using heat.

The plasma may include at least one selected from the group consisting of direct current generated plasma, alternating current generated plasma, radio frequency generated plasma, and ultra-high frequency generated plasma.

A radio frequency bias may be further applied to the semiconductor substrate.

Forming a trench on the semiconductor substrate to define an active region may further include stacking a buffer oxide layer and a hard mask layer on the semiconductor substrate and performing a forming process using at least one forming process selected from the group consisting of forming a hard mask pattern, forming a buffer oxide pattern, or forming a trench on the semiconductor substrate.

A device isolation layer may be formed to fill the trench.

The hard mask pattern and the buffer oxide pattern may be removed and a gate insulator and a gate electrode may be formed on the semiconductor substrate.

Forming a trench on the semiconductor substrate to define an active region may include forming a tunnel insulating layer, a floating gate conductive layer, and a hard mask layer on the semiconductor substrate and performing a forming process using at least one forming process from the group consisting of forming a tunnel insulating pattern, a floating gate pattern, a hard mask pattern, or forming a trench on the semiconductor substrate.

A device isolation layer may be formed to fill the trench. The device isolation layer may be planarized and a blocking insulating layer and a control gate electrode may be formed on the floating gate pattern.

In accordance with an exemplary embodiment of the present invention, semiconductor device includes a trench formed on a semiconductor substrate to define an active region, a radical oxide layer disposed on a sidewall and a bottom surface of the trench, a nitride layer disposed on the radical oxide layer; and a device isolation layer disposed to fill the trench. A conduction band offset of the radical oxide layer is greater than a conduction band offset of a thermal oxide layer having the same thickness as the radical oxide layer.

The radical oxide layer may be formed by oxidizing the semiconductor layer.

A gate insulating pattern and a gate electrode may be disposed on an entire surface of the active region or on a partial surface of the active region.

The semiconductor device may further include a tunnel insulating pattern, a floating gate pattern, a blocking insulating pattern, and a control gate electrode sequentially stacked on an entire surface of the active region or on a partial surface of the active region.

DETAILED DESCRIPTION OF THE EXEMPLARY EMBODIMENTS

Figure 1A:
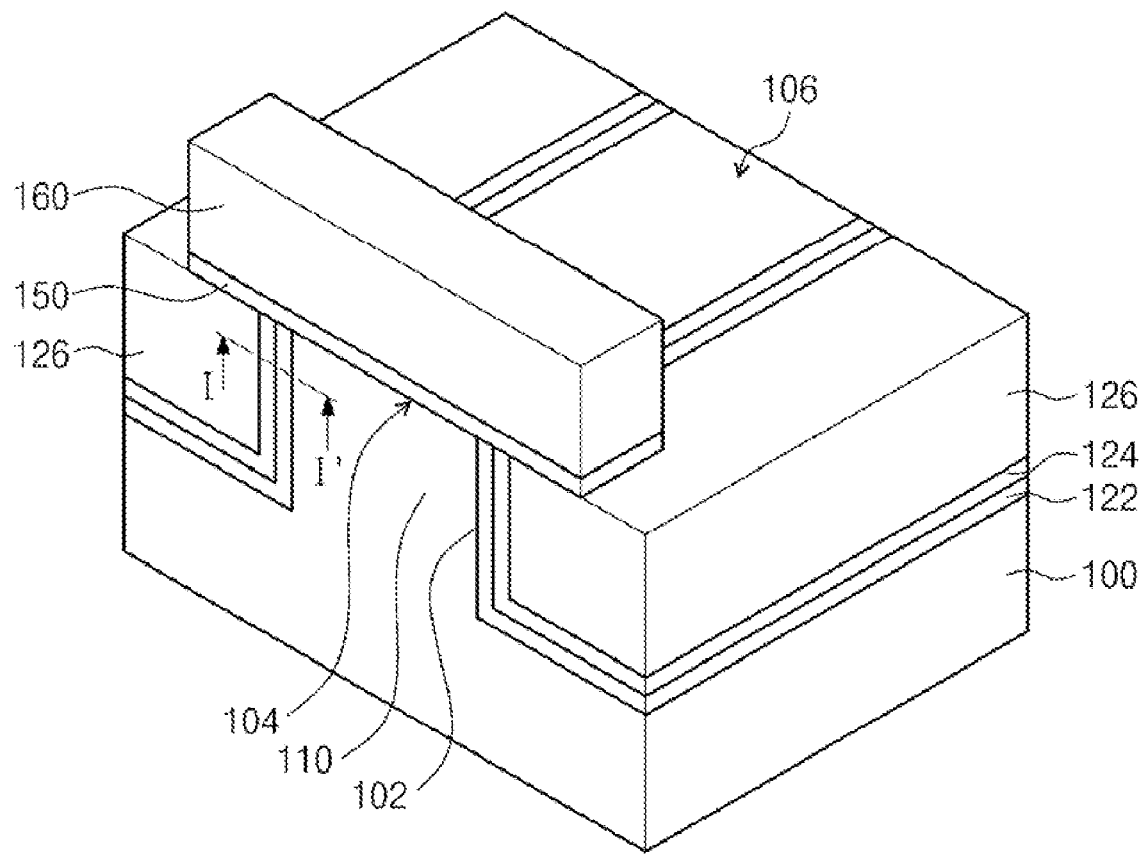
FIGS. 1A and 1B are a perspective view and an energy band diagram of a semiconductor device according to an exemplary embodiment of the present invention, respectively.

The present invention will now be described more fully hereinafter with reference to the accompanying drawings, in which exemplary embodiments of the present invention are shown. The exemplary embodiments, however, can take many different forms and should not be construed as limited to the particular embodiments set forth herein. In the drawings, the thicknesses of layers and regions may be exaggerated for clarity. It will also be understood that when a layer is referred to as being "on" another layer or substrate, it may be directly on the other layer or substrate, or intervening layers may also be present. Like numbers refer to like elements throughout.

Figure 1B:
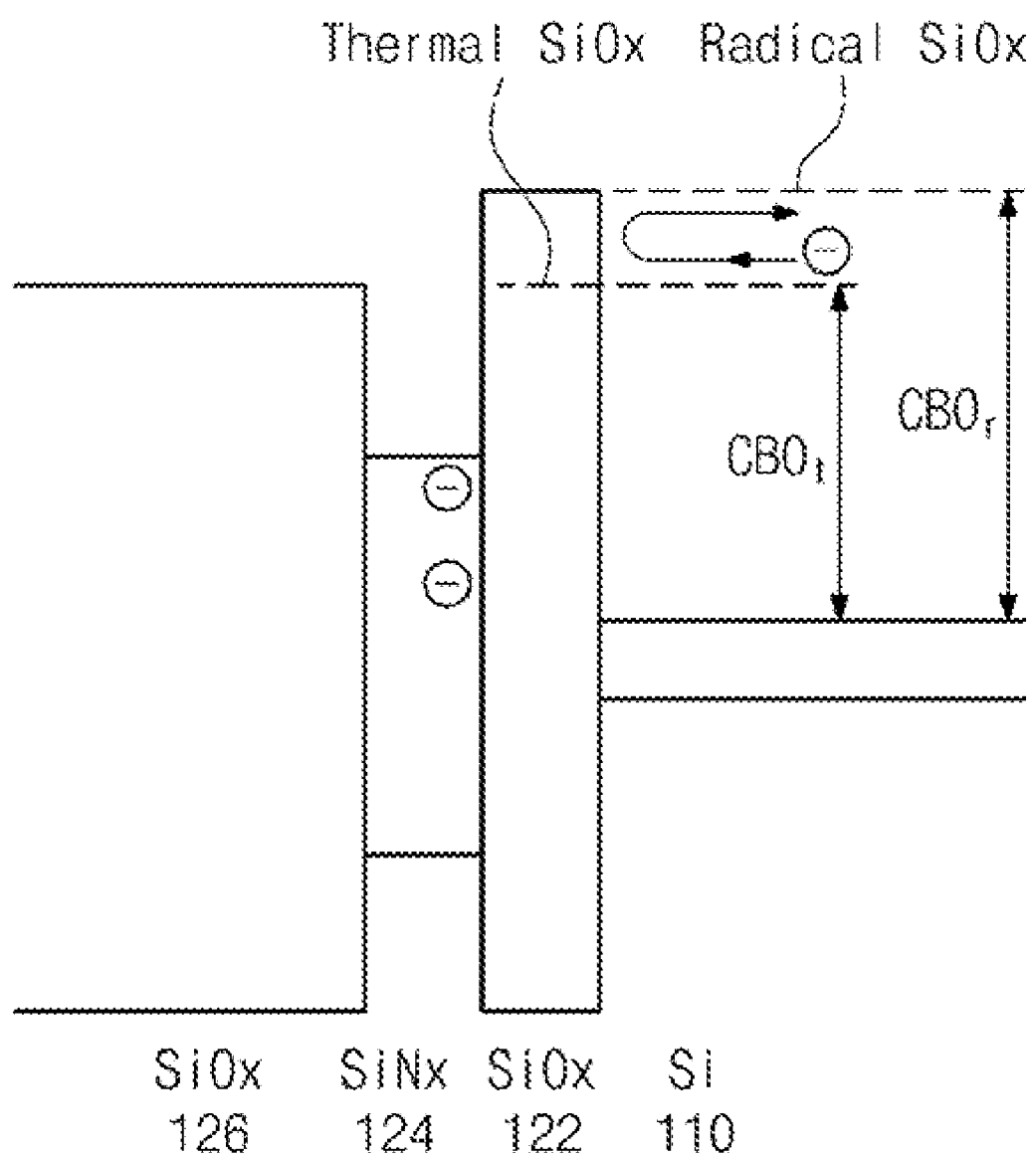

FIG. 1A is a perspective view of a semiconductor device according to an exemplary embodiment of the present invention, and FIG. 1B is an energy band diagram in a cross-sectional view taken along the line I-I' of FIG. 1A. The semiconductor device includes a trench 102 formed to define an active region 110 on a semiconductor substrate 100, a radical oxide layer 122 disposed on a sidewall and a bottom surface of the trench 102, a nitride layer 124 disposed on the radical oxide layer 122, and a device isolation layer 126 disposed to fill the trench 102. A conduction band offset ($CBO_r$) of the radical oxide layer 122 is greater than a conduction band offset ($CBO_t$) of a thermal oxide layer having the same thickness as the radical oxide layer 122. A gate insulator 150 and a gate electrode 160 are sequentially stacked on the active region 110. The gate electrode 160 crosses the active region 110.

A hot electron can be generated in a drain depletion region of a drain area 106 by impact ionization of a hot hole accelerated at a channel area 104 of the semiconductor device. The hot electron can be trapped to the gate insulator 150 adjacent to the drain area 106 to reduce effective channel length. The hot electron generated at the drain area 106 can be trapped at the boundary between an oxide layer and the nitride layer 124 disposed around the trench 102 or in the nitride layer 124. The above procedure can result in hot electron induced punch-through (HEIP). One way to suppress the hot electron trapping is by increasing the thickness of the oxide layer. However, if the oxide layer having the increased thickness is applied, the area of the active region 110 becomes reduced decreasing the operational current of the transistor and the width of the trench 102 becomes reduced making it difficult to form a device isolation layer 126 filling the trench 102. On the other hand, the amount of the hot holes can be reduced by controlling and smoothly changing doping concentration at the junction of the channel area 104 and the drain area 106. However, it becomes difficult to simultaneously control the doping concentration and the short channel effect.

In accordance with an exemplary embodiment of the present invention, the nitride layer 124 is disposed on a radical oxide layer 122. The nitride layer 124 is made of silicon nitride. The device isolation layer 126 is disposed to fill the trench 102 and is made of silicon oxide. A top surface of the device isolation layer 126 is substantially identical to that of the active region 110.

A gate insulator 150 and a gate electrode 160 are sequentially stacked on the active region 110. The gate insulator 150 is made of thermal oxide, and the gate electrode 160 is made of a conductor. The gate electrode 160 includes at least one material selected from the group consisting of a semiconductor, a conductor, and a conductive compound. The gate electrode 160 can have a multi-layer structure.

Referring to FIG. 1B, the oxide layer is a radical oxide layer 122. The radical oxide layer 122 is provided to increase the conduction band offset, as compared to the conduction band offset of a thermal oxide layer having the same thickness as the radical oxide layer 122. Accordingly, the amount of electrons trapped at the radical oxide layer 122 and the nitride layer 124 is reduced and the avoidance of HEIP is enhanced. The conduction band offset ($CBO_r$) of the radical oxide layer 122 disposed on a side surface of the trench 102 is greater than the conduction band offset ($CBO_t$) of the thermal oxide layer. The possibility of hot electrons passing through the radical oxide layer 122 decreases, reducing the amount of electrons trapped at the radical oxide layer 122 and the nitride layer 124.

The semiconductor substrate 100 is a silicon substrate. The semiconductor substrate 100 is etched to form a trench 102 by which the active region 110 is defined. The radical oxide layer 122 is disposed on a bottom surface and a side surface of the trench 102. The radical oxide layer 122 is formed by conformally depositing a semiconductor layer on the entire surface of the semiconductor substrate 100 where the trench 102 is formed and by oxidizing the deposited semiconductor layer. The semiconductor layer can be made of polysilicon or amorphous silicon. The semiconductor layer can be formed by means of atomic layer deposition (ALD) or chemical vapor deposition (CVD).

Figure 2:
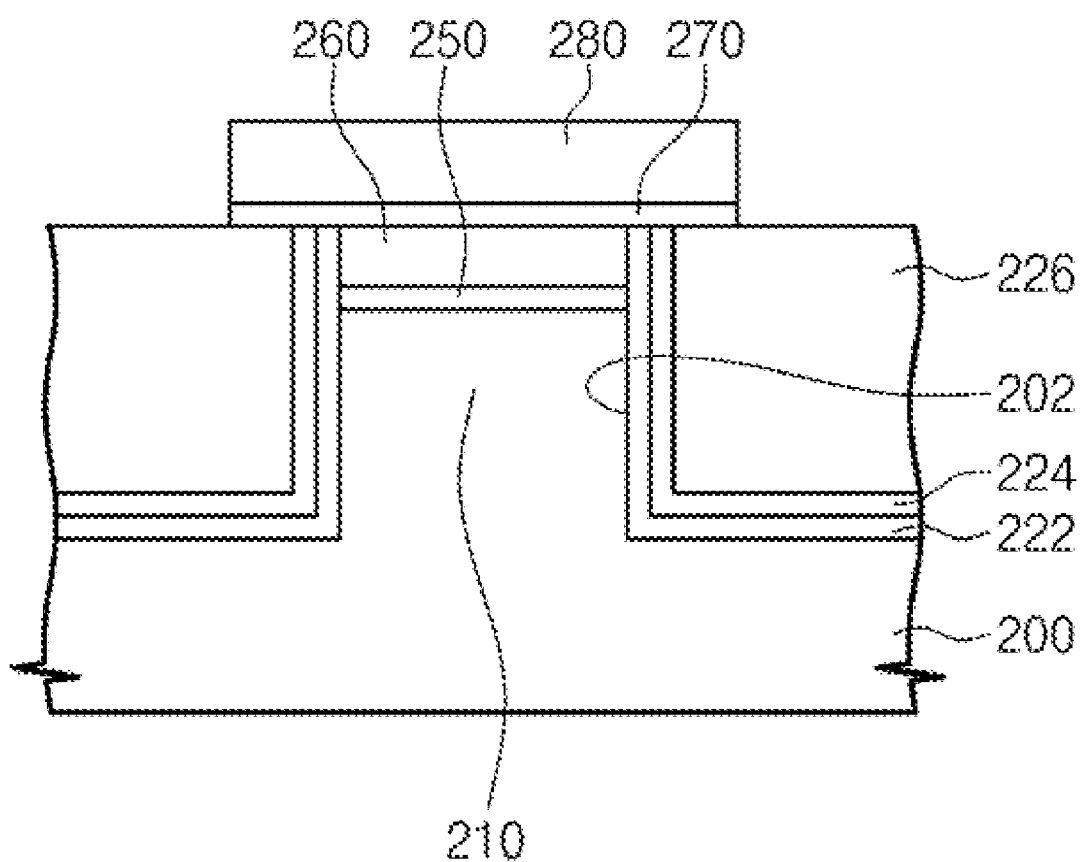
FIG. 2 is a cross-sectional view of a semiconductor device according to an exemplary embodiment of the present invention.

FIG. 2 is a cross-sectional view illustrating a semiconductor device according to an exemplary embodiment of the present invention. The semiconductor device includes a trench 202 formed to define an active region 210 on a semiconductor substrate 200, a radical oxide layer 222 disposed on a sidewall and a bottom surface of the trench 202, a nitride layer 224 disposed on the radical oxide layer 222, and a device isolation layer 226 disposed to fill the trench 202. The conduction band offset ($CBO_r$) of the radical oxide layer 222 is greater than the conduction band offset ($CBO_t$) of a thermal oxide layer having the same thickness as the radical oxide layer 222. The semiconductor device includes a tunnel insulating pattern 250, a floating gate pattern 260, a blocking insulating pattern 270, and a control gate electrode 280 which are sequentially stacked on the entire or partial surface of the active region 210. The tunnel insulating pattern 250 is made of silicon nitride and the floating gate pattern 260 is made of doped polysilicon. The blocking insulating pattern 270 is an insulating layer having a multi-layer structure. The control gate electrode 280 is made of a conductor.

Figure 3A:
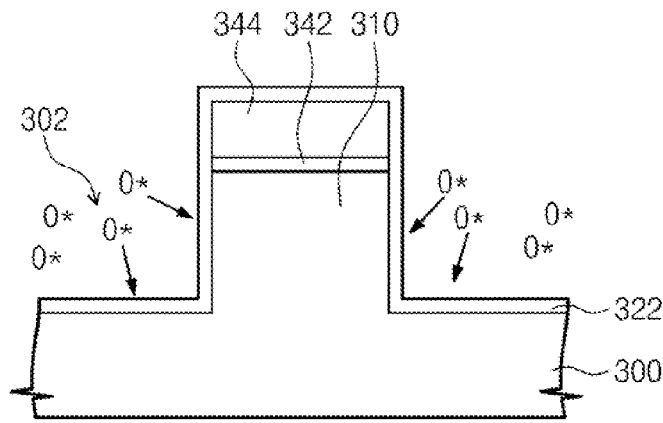
FIGS. 3A and 3B illustrate a method of forming a semiconductor device according to an exemplary embodiment of the present invention, and an energy band diagram of the semiconductor device formed thereby, respectively.
Figure 3B:
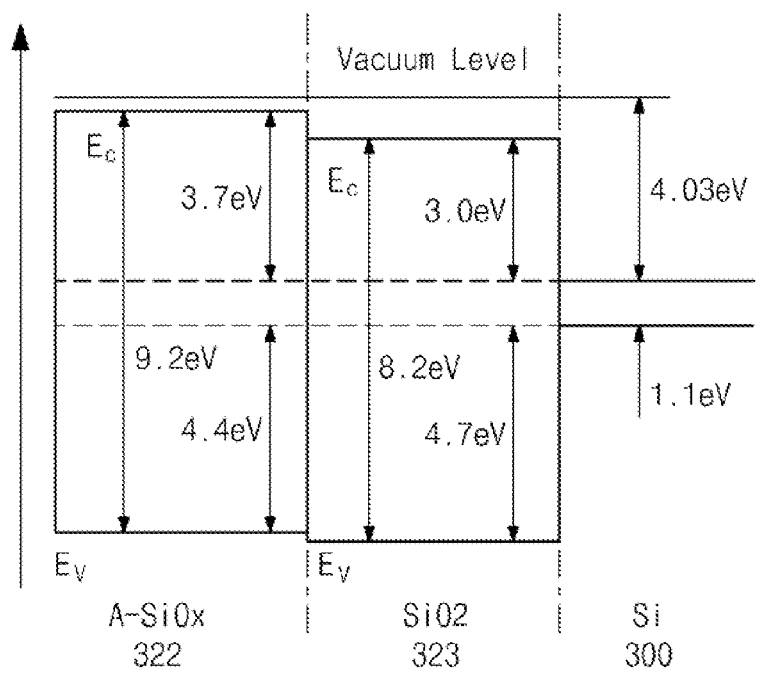

FIGS. 3A and 3B illustrate a method of forming a semiconductor device according to an exemplary embodiment of the present invention, and an energy band diagram of the semiconductor device formed thereby, respectively.

The method includes forming a trench 302 on a semiconductor substrate 300 to define an active region 310, forming a radical oxide layer 322 on a sidewall and a bottom surface of the trench 302, and forming a nitride layer (not shown) on the radical oxide layer 322. The conduction band offset of the radical oxide layer 322 is greater than that of a thermal oxide layer having the same thickness as the radical oxide layer 322.

The trench 302 is formed on the semiconductor substrate 300 to define the active region 310. Specifically, a buffer oxide layer and a hard mask layer are sequentially stacked on the semiconductor substrate 300. The hard mask layer is formed of silicon nitride. The hard mask layer, the buffer oxide layer, and the semiconductor substrate 300 are patterned to form a hard mask pattern 344, a buffer oxide pattern 342, and the trench 302. The active region 310 is defined by the trench 302.

The radical oxide layer 322 is formed on the entire surface of the semiconductor substrate 300 where the trench 302 is formed. A semiconductor layer (not shown) is conformally deposited on the semiconductor substrate 300 where the trench 302 is formed. The semiconductor layer is oxidized to form the radical oxide layer 322. The semiconductor layer can be formed of polysilicon or amorphous silicon. The semiconductor layer can be formed by means of atomic layer deposition (ALD) or chemical vapor deposition (CVD). The oxidization of the semiconductor layer is done by free radical atoms generated from the decomposition of process gas. The process gas contains at least one gas selected from the group consisting of $O_2$, $O_2+H_2$, $N_2O$, or $N_2O+H_2$. In an exemplary embodiment the process gas further contains inert gas. The free radical atoms are generated using plasma, ultraviolet (UV) light, or heat. The plasma can be provided by at least one selected from the group consisting of direct current (DC) generated plasma, alternating current (AC) generated plasma, radio frequency (RF) generated plasma, or ultra-high frequency (UHF) generated plasma. When the semiconductor layer is oxidized by the plasma, RF bias is applied to the semiconductor substrate 300.

In an alternative exemplary embodiment, bottom and side surfaces of the trench 302 are pre-treated chemically or physically before forming the radical oxide layer 322.

Referring to FIG. 3B, energy bands of the semiconductor substrate 300, a thermal silicon oxide layer 323, and the radical oxide layer 322 are shown for comparison. The thermal silicon oxide layer 323 has the same thickness as the radical oxide layer 322. In this case, the conduction band offsets of the thermal silicon oxide layer 323 and radical oxide layer 322 were 3.0 eV and 3.7 eV, respectively. Thus, the HEIP phenomenon is suppressed. The radical oxide layer 322 is an amorphous silicon oxide (a-SiOx) layer formed by oxidizing an amorphous semiconductor layer. The energy band varies with thicknesses of the radical oxide layer 322 and the thermal silicon oxide layer 323. For this reason, the conduction band offsets of the radical oxide layer 322 and the thermal silicon oxide layer 323 were compared under the condition of the same thickness.

Figure 4A:
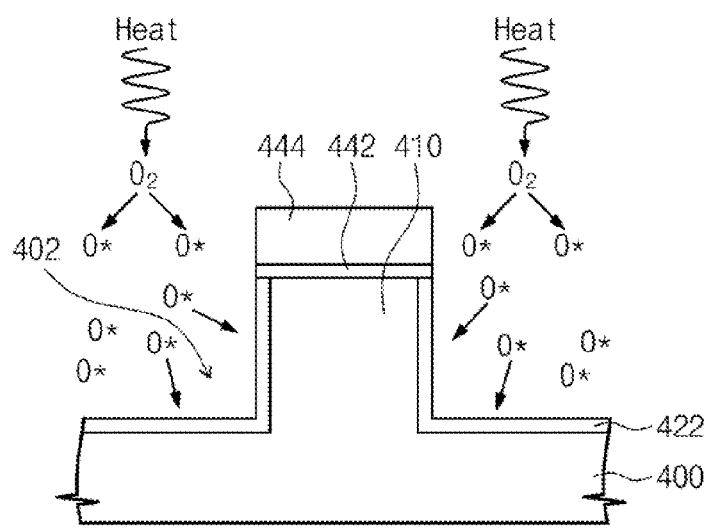
FIGS. 4A and 4B illustrate a method of forming a semiconductor device according to an exemplarty embodiment of the present invention, and an energy band diagram of the semiconductor device formed thereby, respectively.
Figure 4B:
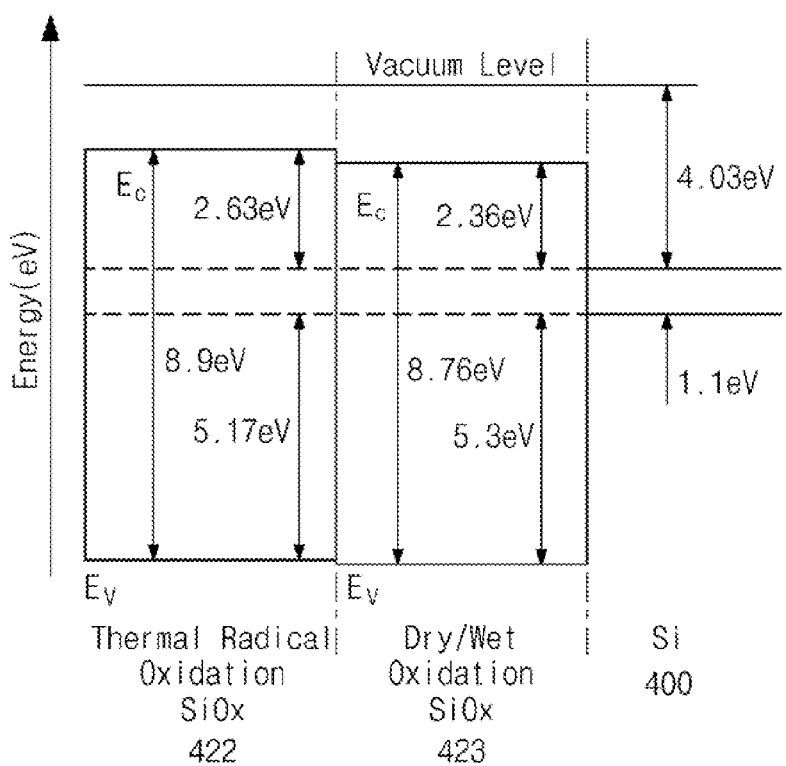

FIGS. 4A and 4B illustrate a method of forming a semiconductor device according to an exemplary embodiment of the present invention, and an energy band diagram taken along the line I-I' of FIG. 1A, respectively.

The method includes forming a trench 402 on a semiconductor substrate 400 to define an active region 410, forming a radical oxide layer 422 on a sidewall and a bottom surface of the trench 402, and forming a nitride layer (not shown) on the radical oxide layer 422. The conduction band offset of the radical oxide layer 422 is greater than the conduction band offset of a thermal oxide layer having the same thickness as the radical oxide layer 422.

A trench is formed on the semiconductor substrate 400 to define an active region. Specifically, a buffer oxide layer and a hard mask layer are sequentially stacked on the semiconductor substrate 400. The buffer oxide layer is formed of thermal oxide, and the hard mask layer is made of silicon nitride. The hard mask layer, the buffer oxide layer, and the semiconductor substrate 400 are patterned to form a hard mask pattern 444, a buffer oxide pattern 442, and a trench 402. The active region 410 is defined by the trench 402.

The radical oxide layer 422 is formed on bottom and side surfaces of the trench 402. The radical oxide layer 422 is formed by oxidizing the bottom and side surfaces of the trench 402. The bottom and side surfaces of the trench 402 are oxidized by free radical atoms which are generated from the thermal decomposition of process gas. The free radical atoms are supplied into a vacuum chamber (not shown) in which the semiconductor substrate 400 is disposed. The process gas contains at least one gas selected from the group consisting of $O_2$, $O_2+H_2$, $N_2O$, or $N_2O+H_2$. In an exemplary embodiment the process gas further contains inert gas.

Referring to FIG. 4B, energy bands of the semiconductor substrate 400, a thermal silicon oxide layer 423, and the radical oxide layer 422 are shown. For the case where the thermal silicon oxide layer 423 has the same thickness as the radical oxide layer 422, the conduction band offset ($CBO_t$) of the thermal silicon oxide layer 423 was 2.36 eV and the conduction band offset ($CBO_r$) of the radical oxide layer 422 was 2.63 eV. Thus, the HEIP phenomenon is suppressed. The thermal oxide layer 423 was formed by means of a dry/wet thermal oxidation process.

Figure 5A:
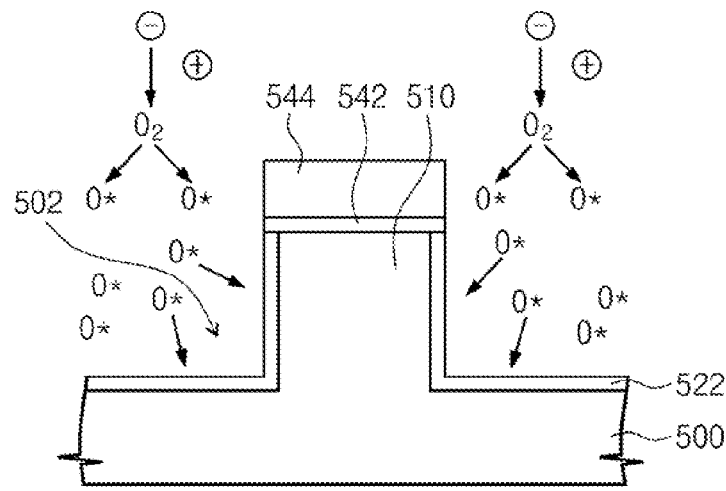
FIGS. 5A and 5B illustrate a method of forming a semiconductor device according to yet an exemplary embodiment of the present invention and an energy band diagram of the semiconductor device formed thereby, respectively.
Figure 5B:
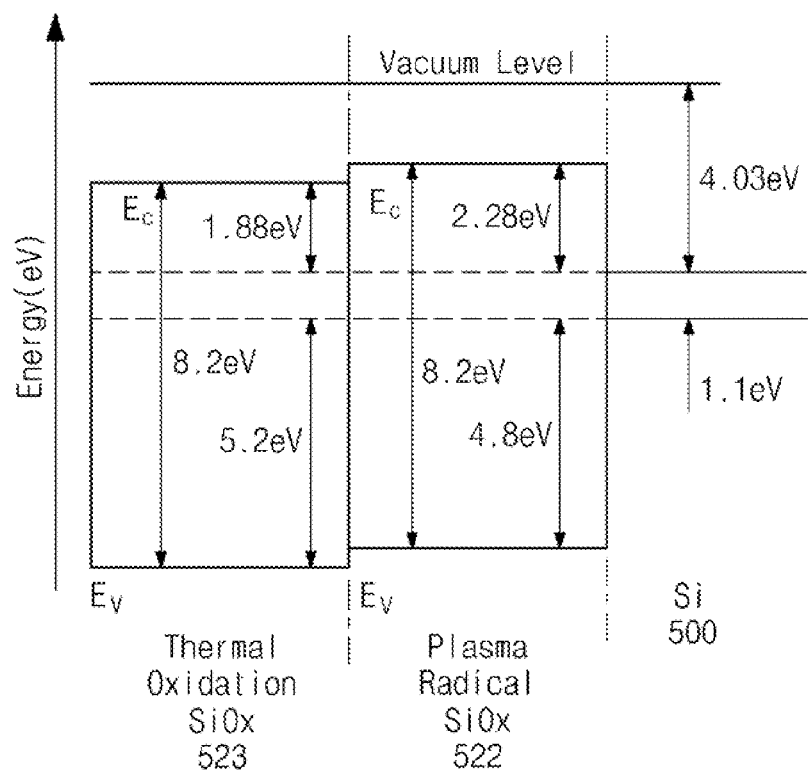

FIGS. 5A and 5B illustrate a method of forming a semiconductor device according to an exemplary embodiment of the present invention, and an energy band diagram of the semiconductor device formed thereby, respectively.

The method includes forming a trench 502 on a semiconductor substrate 500 to define an active region 510, forming a radical oxide layer 522 on a sidewall and a bottom surface of the trench 502, and forming a nitride layer (not shown) on the radical oxide layer 522. The conduction band offset of the radical oxide layer 522 is greater than that of a thermal oxide layer having the same thickness as the radical oxide layer 522.

The trench 502 is formed on the semiconductor substrate 500 to define an active region. Specifically, a buffer oxide layer and a hard mask layer are sequentially stacked on the semiconductor substrate 500. The buffer oxide layer is formed of thermal oxide, and the hard mask layer is made of silicon nitride. The hard mask layer, the buffer oxide layer, and the semiconductor substrate 500 are patterned to form a hard mask pattern 544, a buffer oxide pattern 542, and a trench 502. The active region 510 is defined by the trench 502.

The radical oxide layer 522 is formed on bottom and side surfaces of the trench 502. The radical oxide layer 522 is formed by oxidizing the bottom and side surfaces of the trench 502. The bottom and side surfaces of the trench 502 are oxidized by free radical atoms generated from the decomposition of process gas. The composition of the process gas is provided by plasma generation. The free radical atoms are supplied into a vacuum chamber (not shown) in which the semiconductor substrate 500 is disposed. The process gas contains at least one gas selected from the group consisting of $O_2$, $O_2+H_2$, $N_2O$, or $N_2O+H_2$. In an exemplary embodiment the process gas further contains inert gas. The plasma is at least one selected from the group consisting of DC generated plasma, AC generated plasma, RF generated plasma, or UHF generated plasma. When the plasma is generated inside the vacuum chamber in which the semiconductor substrate 500 is disposed, RF bias is applied to the semiconductor substrate 500.

Referring to FIG. 5B, energy bands of the semiconductor substrate 500, a thermal silicon oxide layer 523, and the radical oxide layer 522 are shown. In the case where the thermal silicon oxide layer 523 has the same thickness as the radical oxide layer 522, the conduction band offsets of the thermal silicon oxide layer 523 and the radical oxide layer 522 were 1.88 eV and 2.28 eV, respectively. Thus, HEIP phenomenon is suppressed. The radical oxide layer 523 was formed by free radical atoms generated by plasma.

Figure 6:
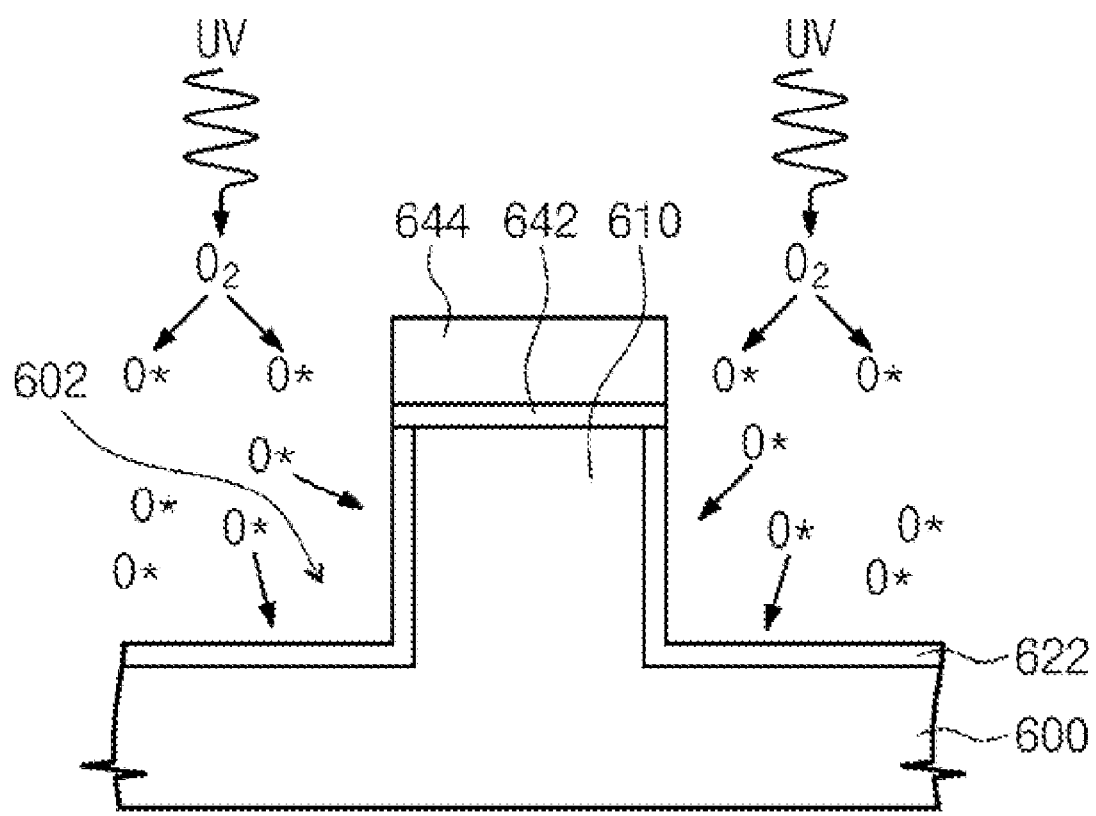
FIG. 6 illustrates a method of forming a semiconductor device according to further an exemplary embodiment of the present invention.

FIG. 6 illustrates a method of forming a semiconductor device according to an exemplary embodiment of the present invention.

The method includes forming a trench 602 on a semiconductor substrate 600 to define an active region, forming a radical oxide layer 622 on a sidewall and a bottom surface of the trench 602, and forming a nitride layer (not shown) on the radical oxide layer 622. The conduction band offset of the radical oxide layer 622 is greater than the conduction band offset of a thermal oxide layer having the same thickness as the radical oxide layer 622.

The trench 602 is formed on the semiconductor substrate 600 to define an active region 610. Specifically, a buffer oxide layer and a hard mask layer are sequentially stacked on the semiconductor substrate 600. The buffer oxide layer is formed of thermal oxide, and the hard mask layer is made of silicon nitride. The hard mask layer, the buffer oxide layer, and the semiconductor substrate 600 are patterned to form a hard mask pattern 644, a buffer oxide pattern 642, and a trench 602. The active region 610 is defined by the trench 602.

The radical oxide layer 622 is formed on bottom and side surfaces of the trench 602. The radical oxide layer 622 is formed by oxidizing the bottom and side surfaces of the trench 602. The bottom and side surfaces of the trench 602 are oxidized by free radical atoms generated from the decomposition of process gas. The decomposition of process gas is done using UV. The free radical atoms are supplied into a vacuum chamber (not shown) in which the semiconductor substrate 600 is disposed. The process gas contains one gas selected from the group consisting of $O_2$, $O_2+H_2$, $N_2O$, or $N_2O+H_2$. In an exemplary embodiment the process gas further contains inert gas.

FIGS. 7A through 7F are cross-sectional views illustrating a method of forming a semiconductor device according to an exemplary embodiment of the present invention.

Figure 7A:
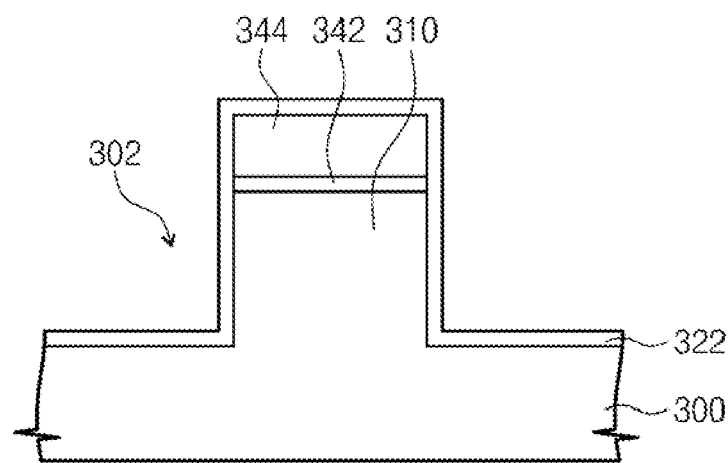
FIGS. 7A, 7B, 7C, 7D, 7E and 7F are cross-sectional views illustrating a method of forming a semiconductor device according to an exemplary embodiment of the present invention.

Referring to FIG. 7A, a buffer oxide layer and a hard mask layer are sequentially stacked on a semiconductor substrate 300. The hard mask layer, the buffer oxide layer, and the semiconductor substrate 300 are patterned to form a hard mask pattern 344, a buffer oxide pattern 342, and a trench 302. An active region 310 is defined by the trench 302. Side and bottom surfaces of the trench 302 are pre-treated chemically and physically. The chemical and physical pre-treatment provide a step of removing semiconductor substrate damaged at a sidewall and the bottom surface of the trench 302. A semiconductor layer 322a is conformally formed on the entire surface of the semiconductor substrate 300 where the trench 302 is formed. The semiconductor layer 322a can be formed of polysilicon or amorphous silicon. The semiconductor layer 322 can be formed by means of atomic layer deposition (ALD) or chemical vapor deposition (CVD).

Returning to FIG. 3A, the semiconductor layer 322 can be oxidized using free radical atoms to form a radical oxide layer. The process gas contains at least one gas selected from the group consisting of $O_2$, $O_2+H_2$, $N_2O$, or $N_2O+H_2$. In an exemplary embodiment the process gas further contains inert gas. The free radical atoms can be generated using plasma, UV, or heat. The plasma can be at least one selected from the group consisting of DC generated plasma, AC generated plasma, RF generated plasma, or UHF generated plasma. When the semiconductor layer 322 is oxidized using plasma, RF bias is applied to the semiconductor substrate 300.

Figure 7B:
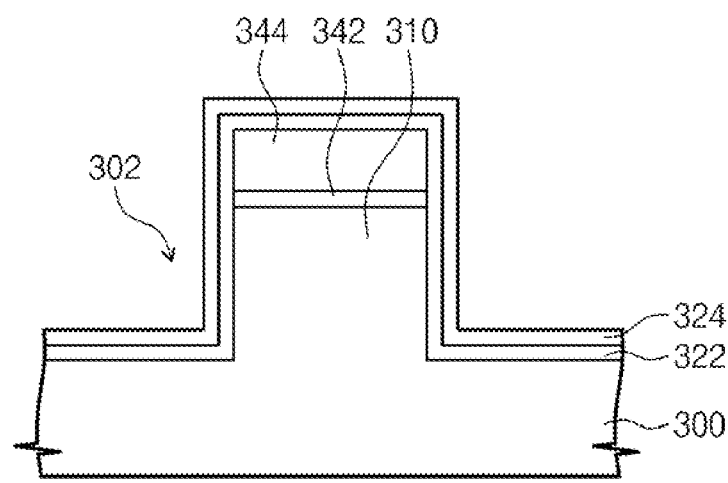

Referring to FIG. 7B, a nitride layer 324 is conformally formed on the radical oxide layer 322. The nitride layer 324 is formed of silicon nitride. The nitride layer 324 can be formed by means of chemical vapor deposition (CVD).

Figure 7C:
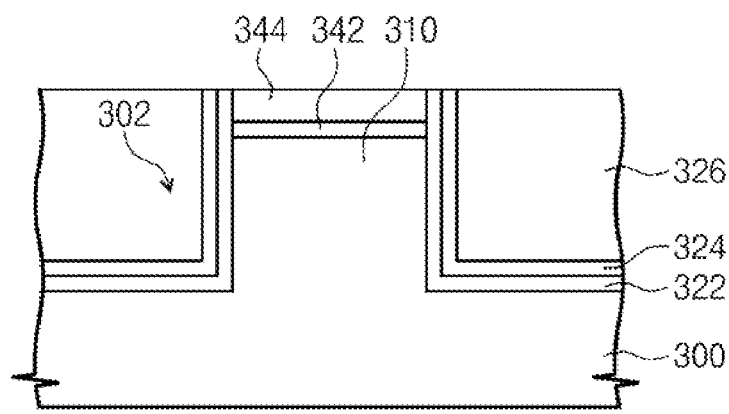

Referring to FIG. 7C, a device isolation layer 326 is deposited to fill the trench 302. A top surface of the device isolation layer 326 is planarized to expose the hard mask pattern 344. The planarization can be done by means of chemical mechanical polishing (CMP).

Figure 7D:
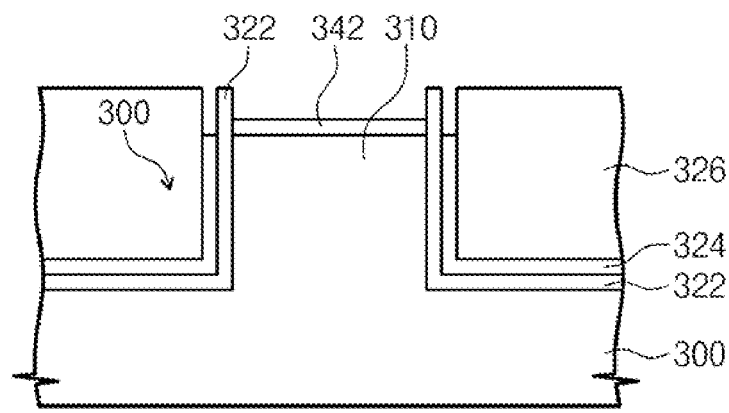

Referring to FIG. 7D, the hard mask pattern 344 is selectively removed by means of wet etch. A top surface of the nitride layer 324 is removed concurrently with the removal of the hard mask pattern 344. The top surface of the nitride layer 324 is lower than that of the buffer oxide layer 342.

Figure 7E:
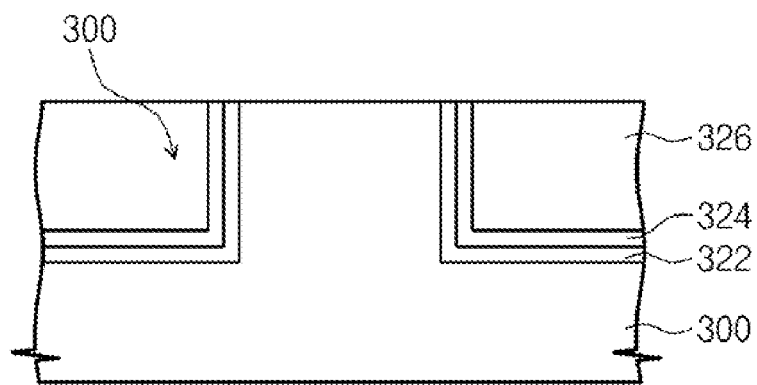

Referring to FIG. 7E, the buffer oxide layer 342, the top surface of the device isolation layer 326, and a top surface of the radical oxide layer 322 are etched to make the top surfaces of the device isolation layer 326 and the active region 310 coplanar and contiguous.

Figure 7F:
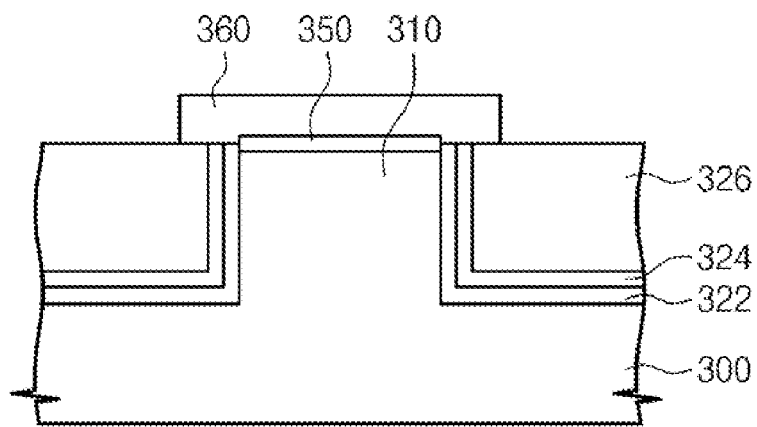

Referring to FIG. 7F, a gate insulator 350 is formed on the active region 310. The gate insulator 350 is a thermal oxide layer, which may be formed by means of a dry or wet oxidation process. A gate electrode 360 is formed on the gate insulator 350. The gate electrode 360 is formed by forming and patterning (not shown).

Figure 8A:
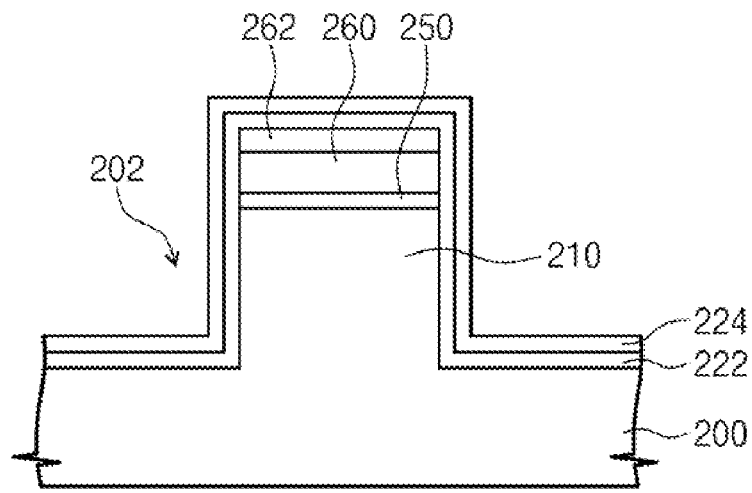
FIGS. 8A and 8B are cross-sectional views illustrating a method of forming a semiconductor device according to an exemplary embodiment of the present invention.
Figure 8B:
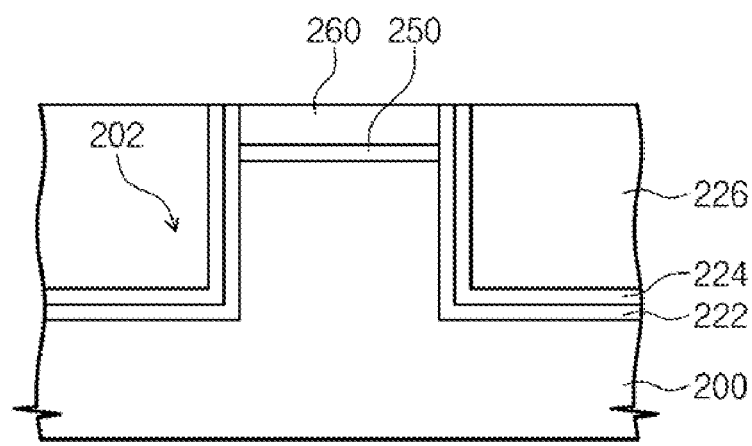

FIGS. 8A and 8B are cross-sectional views illustrating a method of forming a semiconductor device according to an exemplary embodiment of the present invention.

Referring to FIG. 8A, a tunnel insulating layer, a floating gate conductive layer, and a hard mask layer are sequentially stacked on a semiconductor substrate 200. The hard mask layer, the floating gate conductive layer, and the tunnel insulator are formed of silicon nitride, doped silicon, and silicon oxide, respectively. The hard mask layer, the floating gate conductive layer, the tunnel insulating layer, and the semiconductor substrate 200 are patterned to form a hard mask pattern 262, a floating gate pattern 260, a tunnel insulating pattern 250, and a trench 202. The trench 202 is formed to define an active region 210. A semiconductor layer is formed on the entire surface of the semiconductor substrate 200 where the trench 202 is formed. A radical oxide layer 222 is formed using free radical atoms. A nitride layer 224 is conformally formed on the radical oxide layer 222. The nitride layer 224 is formed of silicon nitride.

Referring to FIG. 8B, a device isolation layer 226 is formed to fill the trench 202. The device isolation layer 226 is planarized down to a top surface of the floating gate conductive pattern 260.

Returning to FIG. 2, a blocking insulating pattern 270 and a control gate electrode 280 are formed on the floating gate pattern 260. The control gate electrode 280 is formed by forming and patterning a control gate electrode layer. The control gate electrode 280 is formed of a conductive material. The blocking insulating layer 270 is formed of a high-k dielectric. The blocking insulating layer 270 is patterned.

In an exemplary embodiment of the present invention, at least one of the foregoing exemplary embodiments of the semiconductor devices may be included in an electronic system.

Figure 9:
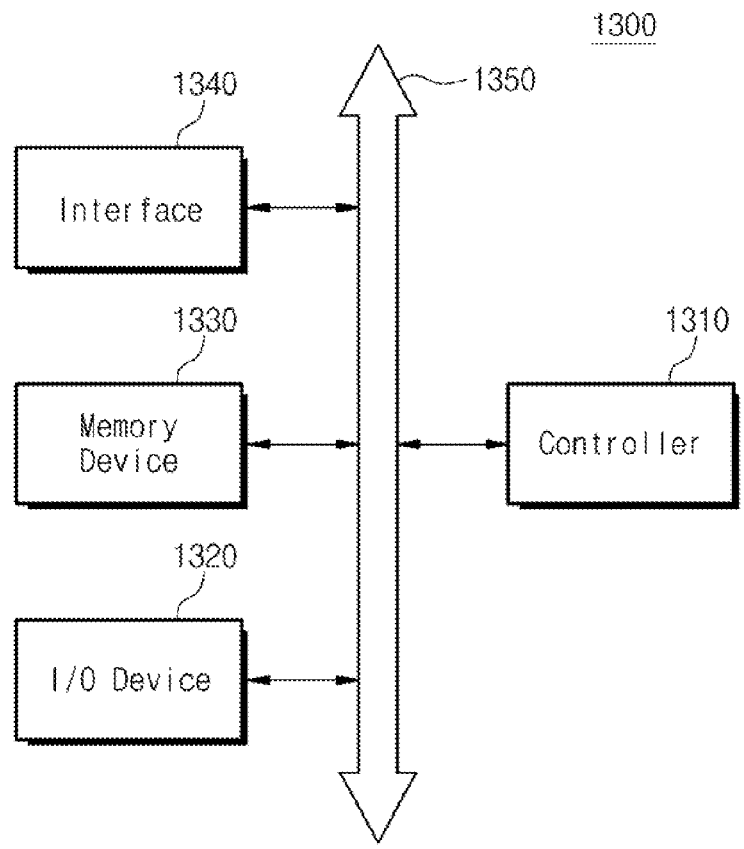
FIG. 9 is a block diagram of an electronic system including a semiconductor device according to exemplary embodiments of the present invention.

FIG. 9 is a block diagram of an electronic system 1300 having a semiconductor device according to at least one of the exemplary embodiments of the present invention described above. The electronic system 1300 includes a controller 1310, an input/output (I/O) device 1320, and a memory device 1330, which are connected via a bus 1350. A semiconductor device is included in at least the memory device 1330. The bus 1350 is a passage along which data is transferred. The controller 1310 includes at least one of a microprocessor, a digital signal processor, a microcontroller, and at least one of logic devices capable of performing similar functions to the above-mentioned elements. The memory device 1330 is a data storage. The memory device 1330 is configured to store data and/or a command executed by the controller 1310. The memory device 1330 includes at least one of the above-described semiconductor devices according to the exemplary embodiments of the present invention. The electronic system 3100 further includes an interface 1340 configured to transfer/receive data to/from a communication network. The interface 1340 can be of a wire or wireless type. The interface 1340 can include, for example, an antenna or a wire/wireless transceiver.

The electronic system 1300 can be implemented as a mobile system, a personal computer (PC), an industrial computer or a system configured to perform a variety of functions. The mobile system can be, for example, a personal digital assistant (PDA), a portable computer, a wet tablet, a mobile phone, a wireless phone, a laptop computer, a memory card, a digital music system or a data transmitting/receiving system. In the case where the electronic system 1300 is a system capable of performing wireless communication, and applies a communication interface protocol for a third generation (3G) communication systems, such as code division multiple access (CDMA), global system for mobile communications (GSM), enhanced time division multiple access (E-TDMA), wideband code division multiple access (WCDMA), and the CDMA2000 mobile phone standard.

A memory card according to embodiments of the present invention will now be described with reference to FIG. 10.

Figure 10:
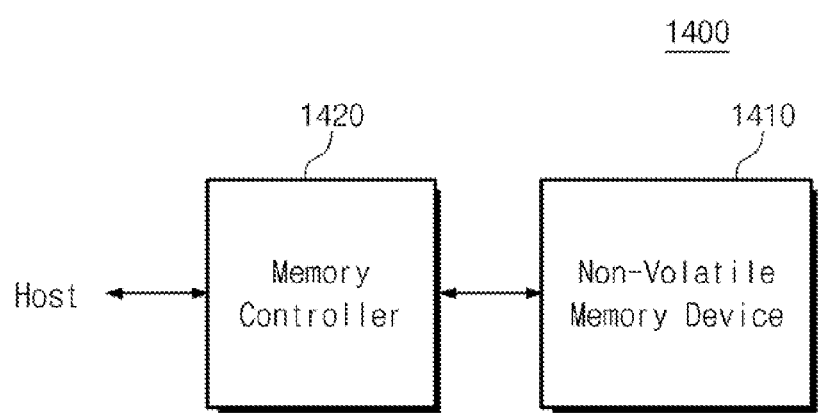
FIG. 10 is a block diagram of a memory card including a semiconductor device according to exemplary embodiments of the present invention.

FIG. 10 is a block diagram of a memory card 1400 including a semiconductor device according to at least one of the exemplary embodiments of the present invention. The memory card 1400 includes a non-volatile memory device 1410 and a memory controller 1420. The semiconductor device is included in the non-volatile memory device 1410 or the memory controller 1420. The non-volatile memory device 1410 is configured to store data or read stored data. The non-volatile memory device 1410 includes at least one of the non-volatile memory devices set forth in the embodiments of the present invention. The memory controller 1420 controls the non-volatile memory device 1410 to read stored data or store data in response to read/write requests of a host.

Although the present invention has been described in connection with exemplary embodiments of the present invention, it is not limited thereto. It will be apparent to those skilled in the art that various substitutions, modifications and changes may be made without departing from the scope and spirit of the invention.

What is claimed is:

1. A method of forming a semiconductor device, comprising:

forming a tunnel insulating layer and a floating gate conductive layer on a semiconductor substrate;

patterning the floating gate conductive layer, the tunnel insulating layer and the semiconductor substrate to form a floating gate pattern, a tunnel insulating pattern and a trench, the trench being formed in a semiconductor substrate to define an active region;

conformally depositing a semiconductor layer on an entire surface of the semiconductor substrate where the trench is formed;

forming a radical oxide layer by oxidizing the semiconductor layer using free radical atoms; and forming a nitride layer directly on the radical oxide layer, wherein a conduction band offset of the radical oxide layer is greater than a conduction band offset of a thermal oxide layer having the same thickness as the radical oxide layer, and wherein a top of the radical oxide layer substantially has a same level as a top of the floating gate pattern.

2. The method as set forth in claim 1, wherein the semiconductor layer is formed of polysilicon or amorphous silicon.

3. The method as set forth in claim 1, wherein conformally depositing a semiconductor layer comprises: performing an atomic layer deposition process or a chemical vapor deposition process.

4. The method as set forth in claim 1, wherein oxidizing the semiconductor layer comprises:

generating free radical atoms from the decomposition of process gas; and oxidizing the semiconductor layer using the free radical atoms.

5. The method as set forth in claim 4, wherein the process gas contains at least one gas selected from the group consisting of $O_2$, $O_2+H_2$, $N_2O$, or $N_2O+H_2$.

6. The method as set forth in claim 5, wherein the process gas further comprises inert gas.

7. A method of forming a semiconductor device, comprising:

forming a tunnel insulating layer and a floating gate conductive layer on a semiconductor substrate;

patterning the floating gate conductive layer, the tunnel insulating layer and the semiconductor substrate to form a floating gate pattern, a tunnel insulating pattern, and a trench, the trench being formed in a semiconductor substrate to define an active region;

forming a radical oxide layer on side and bottom surfaces of the trench and a side of the floating gate pattern; and forming a nitride layer on the radical oxide layer, wherein a top of the radical oxide layer substantially has a same level as a top of the floating gate pattern, wherein a conduction band offset of the radical oxide layer is greater than a conduction band offset of a thermal oxide layer having the same thickness as the radical oxide layer, and wherein the radical oxide layer is formed by free radical atoms generated using at least one process selected from the group consisting of decomposition of process gas using plasma generation, decomposition of process gas using ultraviolet light, or decomposition of process gas using heat.

8. The method as set forth in claim 7, wherein the plasma includes at least one selected from the group consisting of direct current generated plasma, alternating current generated plasma, radio frequency generated plasma, or ultra-high frequency generated plasma.

9. The method as set forth in claim 8, further comprising applying radio frequency bias to the semiconductor substrate.

10. The method as set forth in claim 1,
further comprising forming a device isolation layer to fill the trench,
wherein a top of the device isolation layer substantially has a same level as a top of the floating gate pattern.

11. The method as set forth in claim 10, further comprising:
forming a gate insulator and a gate electrode on the floating gate pattern.

12. The method as set forth in claim 7, further comprising:
forming a device isolation layer to fill the trench;
planarizing the device isolation layer; and
forming a blocking insulating layer and a control gate electrode on the floating gate pattern.

13. A method of forming a semiconductor device, comprising:
forming a trench without an insulation layer directly on side and bottom surfaces of the trench, the trench being formed in a semiconductor substrate to define an active region;
forming a radical oxide layer by oxidizing the side and bottom surfaces of the trench using free radical atoms; and
forming a nitride layer directly on the radical oxide layer, wherein a conduction band offset of the radical oxide layer is greater than a conduction band offset of a thermal oxide layer having the same thickness as the radical oxide layer,
forming a tunnel insulating layer and a floating gate conductive layer on the semiconductor substrate; and
patterning the floating gate conductive layer and the tunnel insulating layer to form a floating gate pattern and a tunnel insulating pattern on the active region,
wherein forming the radical oxide layer comprises oxidizing a side surface of the floating gate pattern using free radical electrons.

14. The method as set forth in claim 13, wherein a top of the radical oxide layer substantially has a same level as a top of the floating gate pattern.

15. The method as set forth in claim 13,
further comprising forming a device isolation layer to fill the trench,
wherein a top of the device isolation layer substantially has a same level as a top of the floating gate pattern.

* * * * *